United States Patent
Wu

(10) Patent No.: US 7,078,780 B2
(45) Date of Patent: Jul. 18, 2006

(54) SCHOTTKY BARRIER DIODE AND METHOD OF MAKING THE SAME

(75) Inventor: Shye-Lin Wu, No. 10, Alley 53, Lane 454, Chen Kung Road, Hu Kuo Hsiang, Hsinchu Hsien (TW)

(73) Assignees: Shye-Lin Wu, Hsinchu Hsien (TW); Chip Integration Tech., Co., Ltd., Hsin-Chu (TW)

( * ) Notice: Subject to any disclaimer, the term of this patent is extended or adjusted under 35 U.S.C. 154(b) by 1 day.

(21) Appl. No.: 10/826,304

(22) Filed: Apr. 19, 2004

(65) Prior Publication Data

US 2005/0230744 A1    Oct. 20, 2005

(51) Int. Cl.
*H01L 31/62*    (2006.01)
(52) U.S. Cl. .................... 257/471; 257/155; 257/671
(58) Field of Classification Search ............. 257/155, 257/471, 473, 484, 485, 622, E21.359, E27.051, 257/E29.327, E29.338
See application file for complete search history.

(56) References Cited

U.S. PATENT DOCUMENTS

| 2002/0008237 A1* | 1/2002 | Chang et al. ................. 257/54 |
| 2004/0256690 A1* | 12/2004 | Kocon ........................ 257/471 |

* cited by examiner

*Primary Examiner*—Thomas L. Dickey
(74) *Attorney, Agent, or Firm*—Troxell Law Office, PLLC

(57) ABSTRACT

A power Schottky rectifier device having a plurality of first trenches filled in with an un-doped polycrystalline silicon layer and each first trenches also has a p-region beneath the bottom of said first trenches to block out reverse current while a reverse biased is applied and to reduce minority carrier while forward biased is applied. Thus, the power Schottky rectifier device can provide first fast switch speed. The power Schottky rectifier device is formed with termination region at an outer portion of the substrate. The manufacture method is also provided.

4 Claims, 10 Drawing Sheets

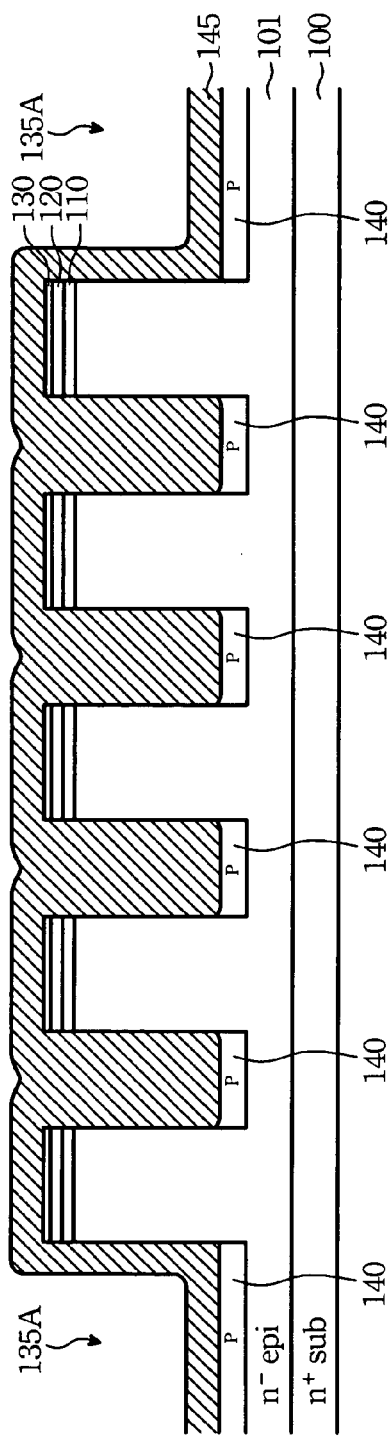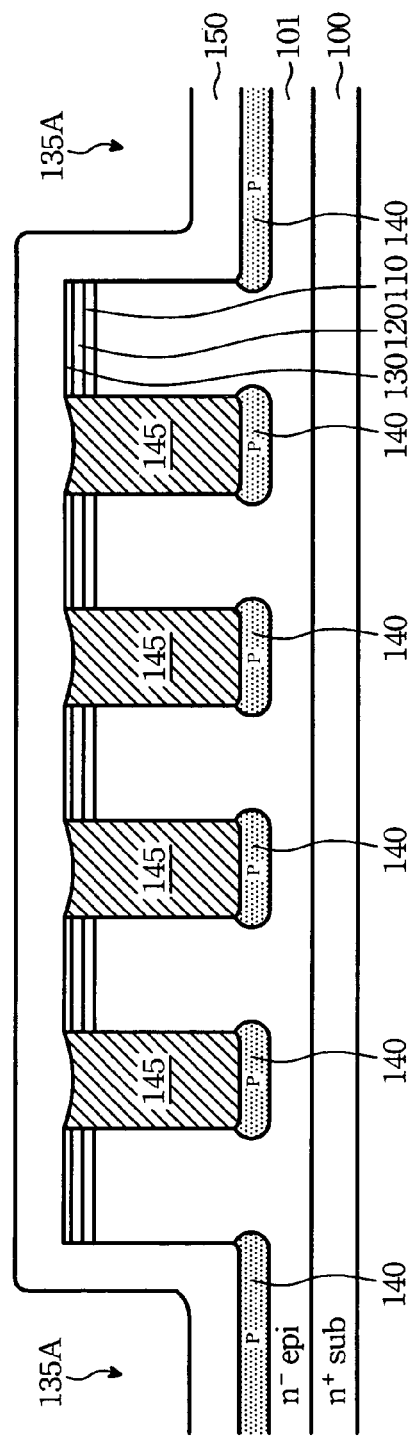

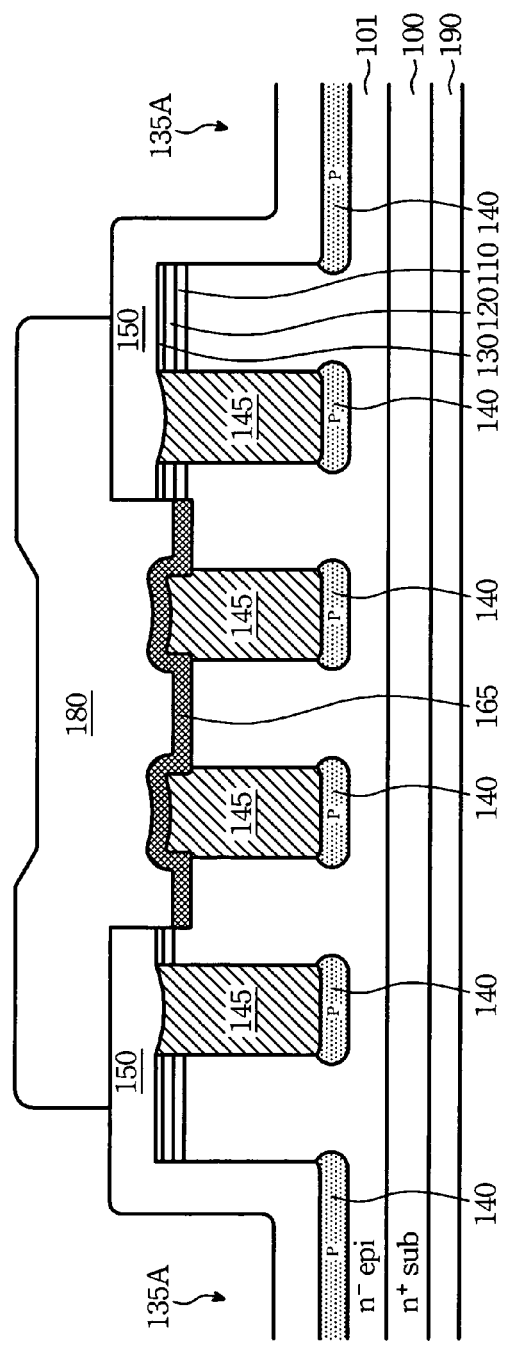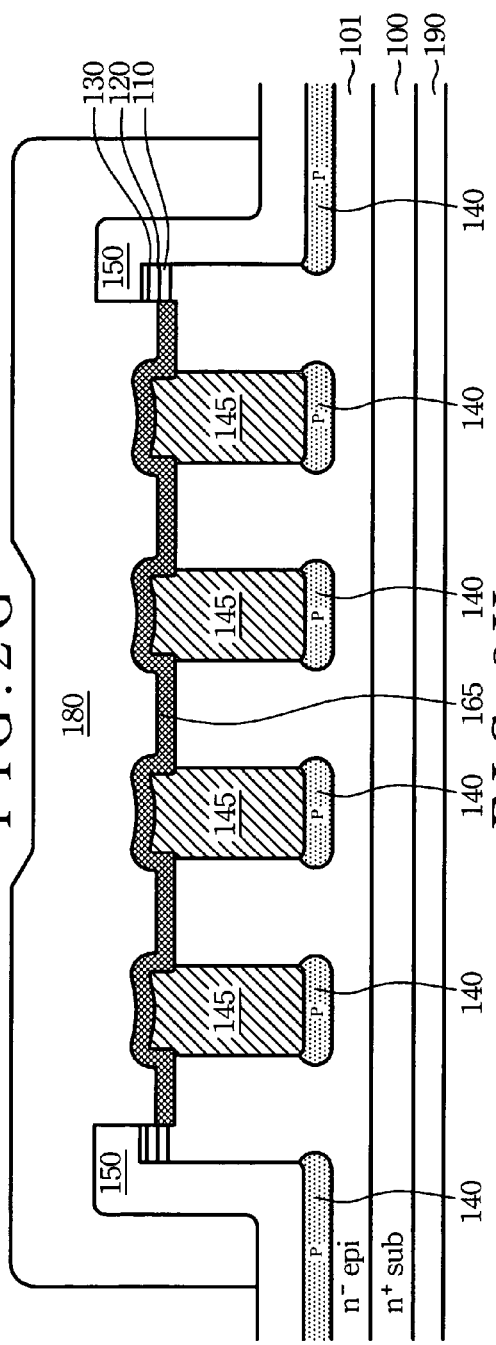

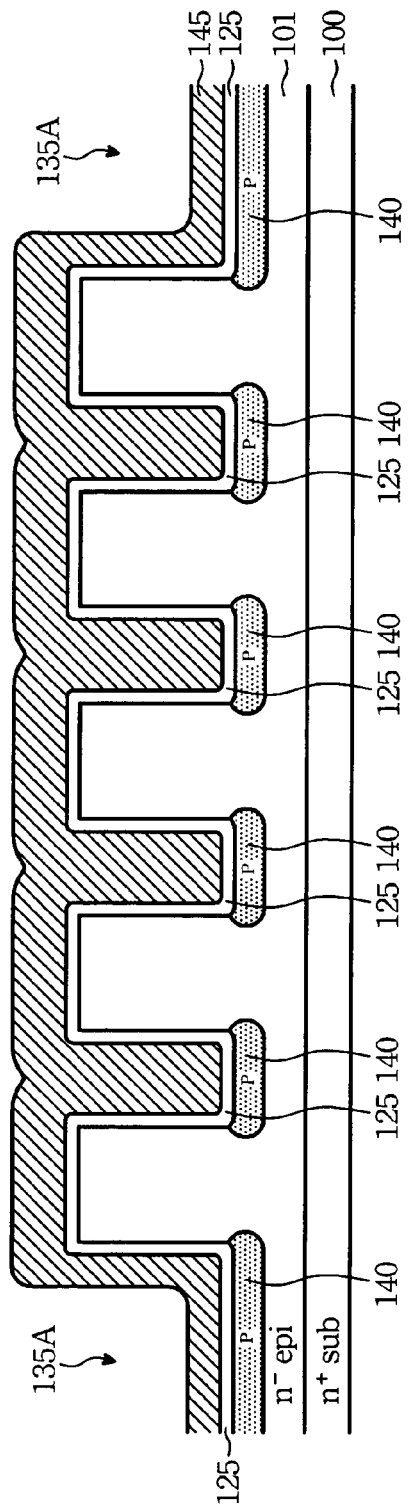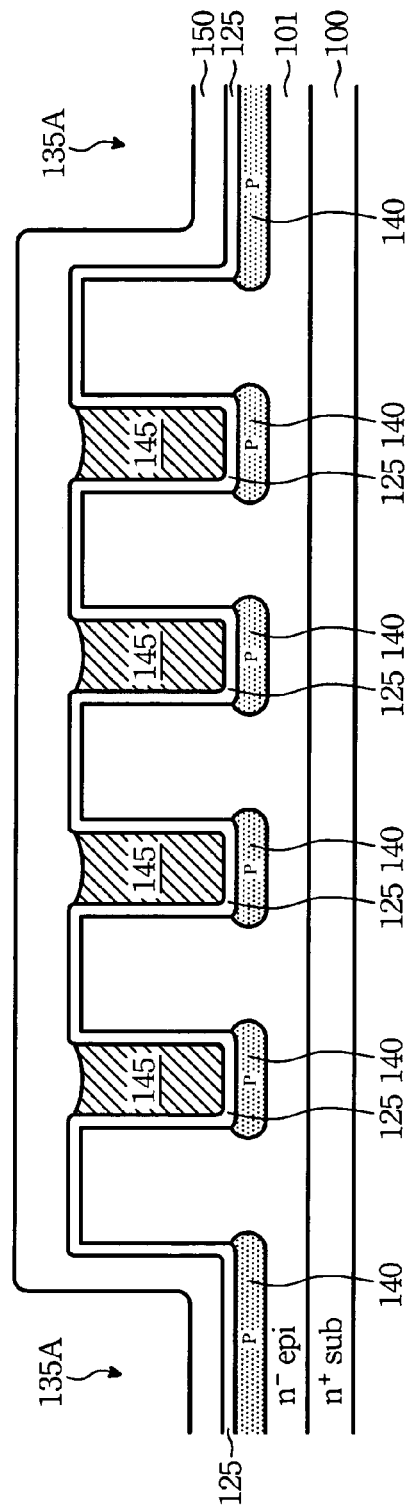

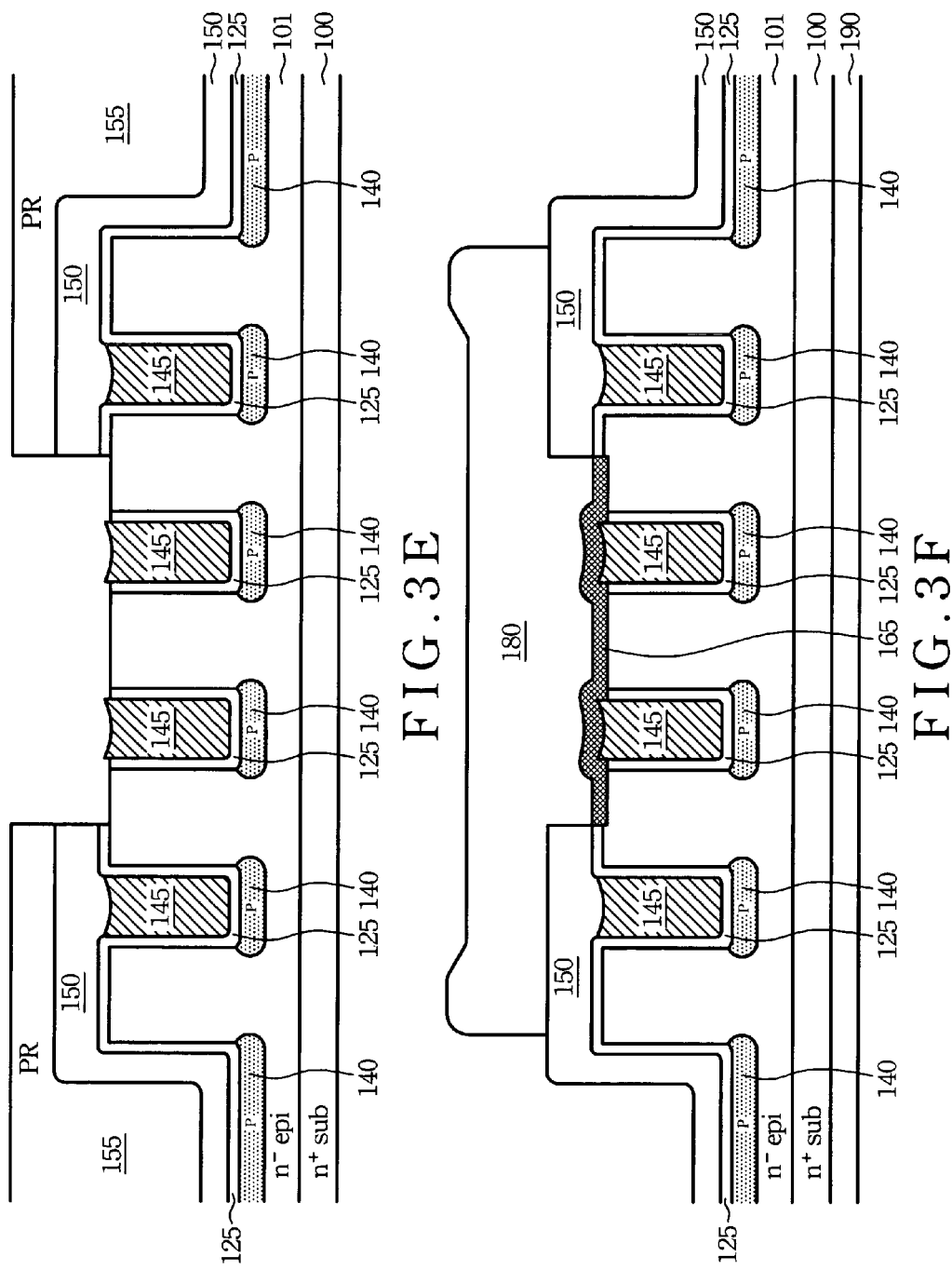

SCHOTTKY BARRIER DIODE AND METHOD OF MAKING THE SAME

FIELD OF THE INVENTION

The present invention relates to a semiconductor process, specifically, to a Schottky barrier power rectifier having buried p-region beneath un-doped polycrystalline trench structure to reduce reverse leakage current, and improve breakdown voltage, and reduce minority current while forward biased, which results in a high switching speed.

BACKGROUND OF THE INVENTION

Schottky diode is an important power device and used extensively as output rectifiers in switching-mode power supplies and in other high-speed power switching applications, such as motor drives, switching of communication device, industry automation and electronic automation and so on. The power devices are usually required characteristics of carrying large forward current, high reverse-biased blocking voltage, such as above 100 volt, and minimizing the reverse-biased leakage current.

A number of power rectifiers have been used to provide high current and reverse blocking characteristics. An exemplary method to form a Schottky barrier diode is disclosed by Chang et al in U.S. Pat. No. 6,404,033. The processes are shown in FIG. 1A to FIG. 1C. Referring to FIG. 1A, a semiconductor substrate having an n+ doped layer 10 and an n− drift layer 12 extended to a first surface 13 is prepared. A field oxide layer 14 is then formed on the first surface 13. Afterward, the field oxide layer 14 is patterned to define positions of guard ring 22 at the termination region. Guard ring regions 22 are then buried into n− drift layer 12 by double implants with $B^+$ and $BF_2^+$ as conductive impurities. Thereafter, a thermal anneal process is then performed to drive in and activate the impurities. Thereafter, a second photoresist pattern 24 is then coated on the resultant surface to define an anode region. The results are shown in FIG. 1B.

Referring to FIG. 1C, a wet etch is then performed to remove those exposed field oxide layer 14. After stripping away the photoresist pattern 24, another photoresist pattern 28 having openings is formed on the resultant surface to define trenches at the active region. An etching step is then performed to recess the drift layer 12 using the photoresist pattern 28 as a mask. Another $B^+$ or $BF_2^+$ ion implant is then carried out to form p type region 30 buried into trench bottom.

Referring to FIG. 1D, the photoresist pattern 28 is removed. Then, a Schottky barrier metal layer 32 is formed on the resultant surface. Thereafter, a top metal layer formation is followed. A forth photoresist (not shown) and an etch steps are then performed to define the top electrode 36. After the layers formed on the backside surface during forgoing step are removed, a metal layer 60 is then formed, which is used as a bottom electrode 34.

Although the Schottky barrier rectifier disclosed in U.S. Pat. No. 6,404,033 having pluralities of trenches to increase the surface area thereto increases forward current capacity and having buried p layers 30 at the bottom of the trenches to form p-n junction regions to increase breakdown voltage. However, it requires a complex processes at least four to six masks. And also, the buried p-n junctions will introduce many minority carriers when device is under forward bias, which will result in a larger reverse recovery time than the typical Schottky barrier rectifier. The object of the present method is to improve the breakdown voltage and enhance the forward current capacity and simplify the manufacturing processes.

SUMMARY OF THE INVENTION

A power Schottky rectifier device and method of making the same are disclosed. The method of forming the Schottky barrier rectifier comprises the following steps: firstly, an n+ doped substrate formed with an n− drift layer, and an ONO hard mask layer is provided. Subsequently, the n− drift layer is recessed to form a plurality of first trenches and a pair of termination trenches at an outer portion of the substrate by the hard mask. A silicon layer is then deposited till the first trenches are filled in and over the uppermost surface of the hard mask to a predetermined thickness. A thermal oxidation is then carried out to oxidize the silicon layer outside the first trenches.

The active region is then defined by using the photolithography and dry etching processes. A metallization process is performed to form a silicide layer on the active region.

In the first preferred embodiment, the active region is an area includes all but the outermost one of the first trenches at both terminals along a cross-sectional view. Next, a top metal layer is formed on all areas. The top metal layer is then patterned to defined anode electrode. The anode electrode covers all of the first trenches 135 but ends before termination trenches 135A. Then, the backside metallization is formed to serve as cathode electrode.

In the second preferred embodiment, the processes are similar to the first preferred embodiment but the active region includes all of the first trenches from a cross-sectional view. Next, a top metal layer is formed on all areas. The top metal layer is then patterned to defined anode electrode. The anode electrode covers all of the first trenches and a portion of termination trenches. Then, the backside metallization is formed to serve as cathode electrode.

In the third preferred embodiment, the processes include using a hard mask defining first trenches and termination trenches and performing an ion implant to form p-regions. The hard mask is then removed. An anneal process to form a thermal oxide lining is then followed. Thereafter, a silicon layer is deposited to fill in the first trenches and over the uppermost surface of the thermal oxide lining to a predetermined thickness. A thermal oxidation is then carried out to oxidize the silicon layer out of the first trenches. Then the active region defined, the metallization process, and the anode electrode formation, cathode electrode formation are the same as the first preferred embodiment.

In the fourth preferred embodiment, the processes are similar to the third preferred embodiment but the active region includes all of the first trenches from a cross-sectional view. Then the metallization process, and the anode electrode formation, cathode electrode formation are the same as the second preferred embodiment.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2C is a cross-sectional view of forming a silicon layer in accordance with the present invention.

FIG. 2D is a cross-sectional view of performing a thermal oxidation to oxidize the silicon layer out of the first trenches in accordance with the present invention.

FIG. 2G is a cross-sectional view of Schottky diode in accordance with the first preferred embodiment of the present invention.

FIG. 2H is a cross-sectional view of Schottky diode in accordance with the second preferred embodiment of the present invention.

FIG. 3C is a cross-sectional view of forming a silicon layer in accordance with the present invention.

FIG. 3D is a cross-sectional view of performing a thermal oxidation to oxidize the silicon layer out of the first trenches in accordance with the present invention.

FIG. 3E is a cross-sectional view of defining an active region in accordance with the present invention.

FIG. 3F is a cross-sectional view of forming a barrier metal layer and then thermal anneal to form silicide in accordance with the present invention.

DETAILED DESCRIPTION OF THE PREFERRED EMBODIMENT

Figure 1A:
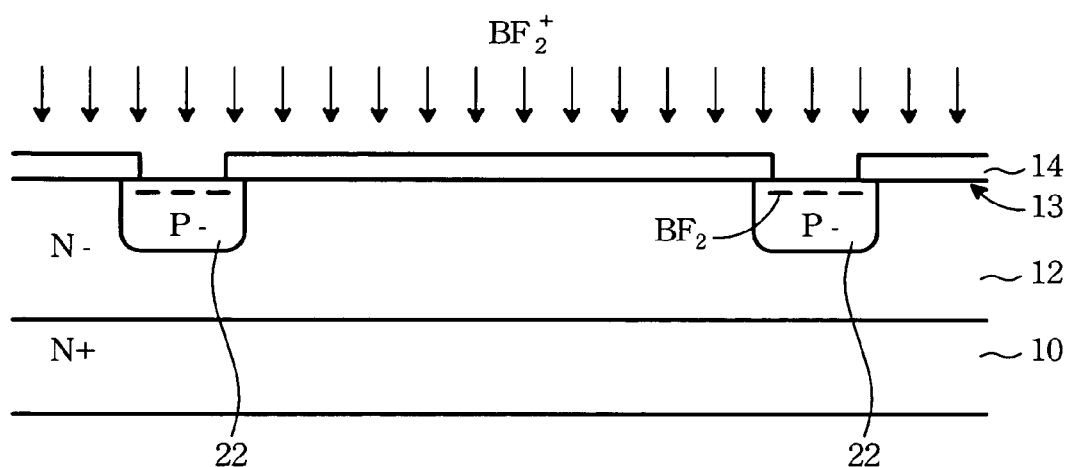
FIGS. 1A to 1D show steps of forming a conventional Schottky barrier diode with a plurality of trenches and p-region at the bottom of each trench and p+ guard ring structure at the termination in accordance with prior art.
Figure 1B:
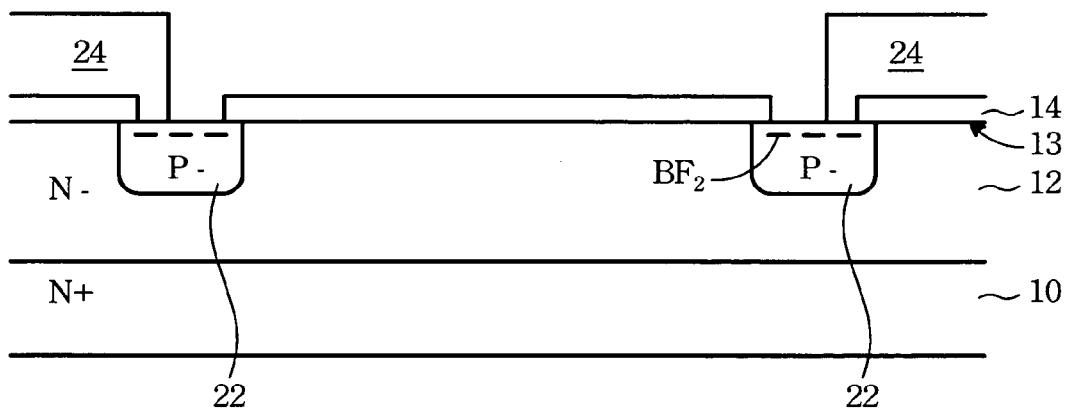
Figure 1C:
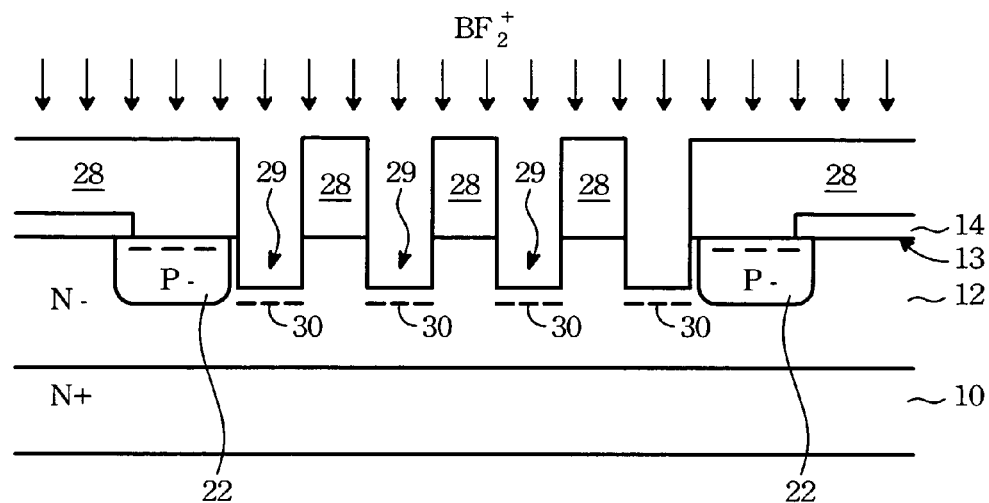
Figure 1D:
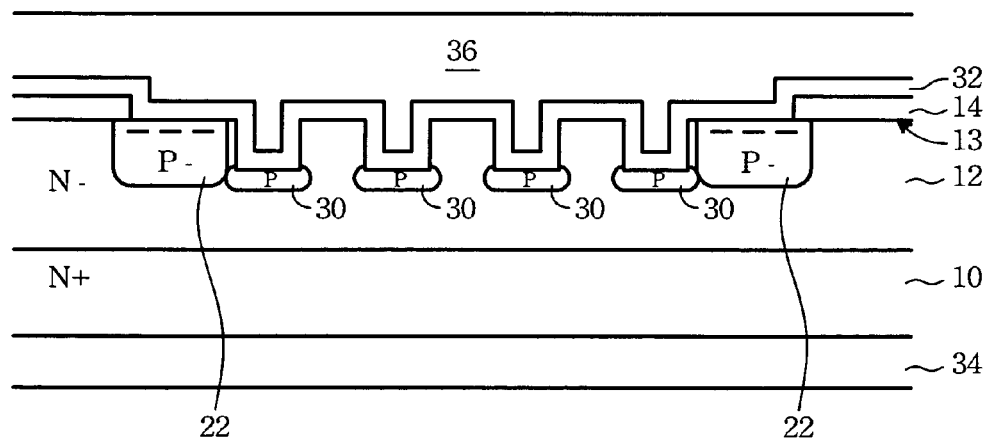
Figure 2A:
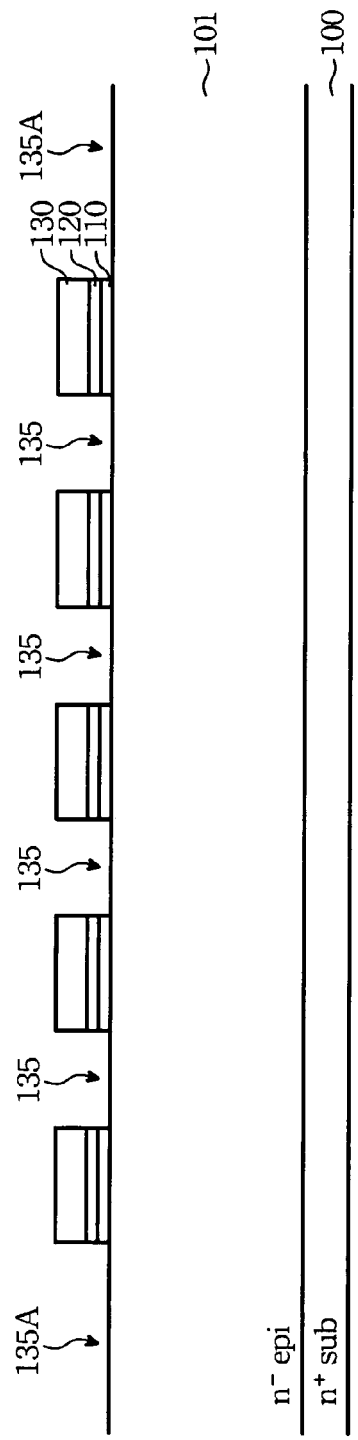
FIG. 2A is a cross-sectional view of forming a hard mask on an n− epi layer in accordance with the present invention.

As depicted in the forgoing background of the invention, to form a power rectifier device and its termination structure using the conventional technique requires at least four to six photo masks. The present invention can simplify the processes by using only three photo masks. The detailed descriptions are as follows:

Firstly, an n+ doped substrate 100 formed with an n− drift layer 101 is provided. To define trenches, referring to FIG. 2A, an ONO stack layer formed of a pad oxide layer 110, a nitride layer 120, and a thick oxide layer 130 is formed on the n− drift layer 101. Preferably, the layers 110, 120, and 130, are, respectively, between about 5 to 100 nm, 50–300 nm, and 0 to 1000 nm in thickness. A lithographic technique and etching steps are then performed to pattern the ONO stack layer so as to define a hard mask having opening 135, and 135A.

Figure 2B:
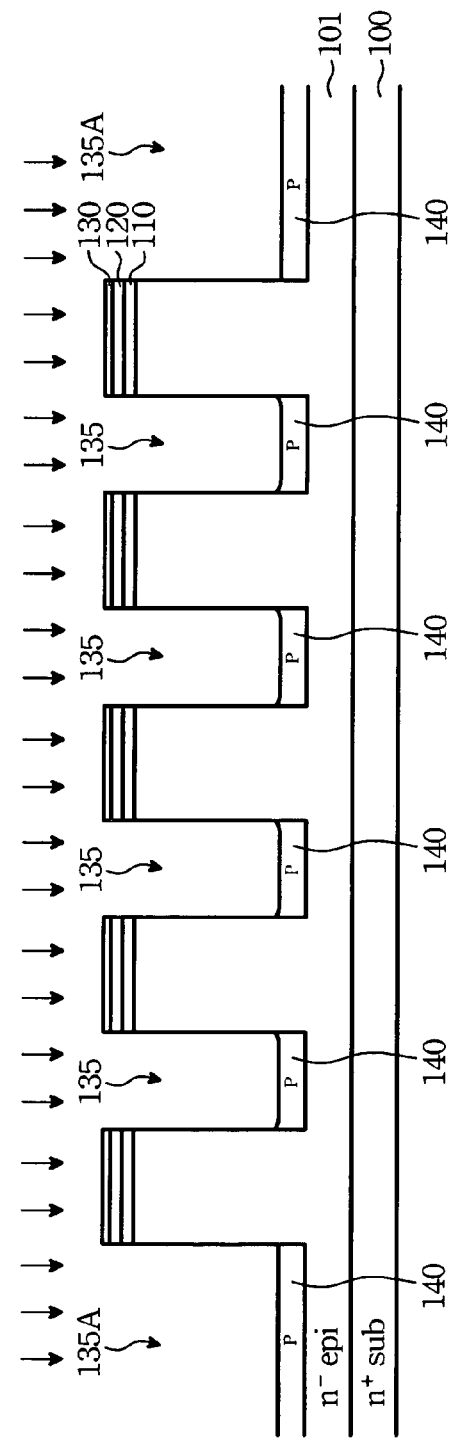
FIG. 2B is a cross-sectional view of patterning the n− epi layer to form first trenches and termination trenches and then performing an ion implant to form p-regions in accordance with the present invention.

Referring to FIG. 2B, an etching step is then performed to form first trenches 135, and termination trenches 135A which are recessed into the ONO stack layer 110, 120, and 130 and the n− drift layer 101. The first trenches 135 are located at a core portion of the substrate and the termination trenches 135A are located at an outermost portion of the substrate. After that a p-type impurity implantation process, for example, is then carried out to implant B+ or $BF_2$+ ions into the n− epi layer 101 to form a p regions 140, which are beneath the bottoms of the trenches 135 and 135A. The dosage and the implant energy are about $5\times10^{10}$–$5\times10^{14}$/$cm^2$ and 10–1000 keV for boron ions and about $5\times10^{11}$–$5\times10^{15}$/$cm^2$ and 30–300 keV for $BF_2^+$ ions.

Turning to FIG. 2C, an undoped polycrystalline, or amorphous silicon 145 is then deposited by LPCVD to fill the first trenches 130 and the termination trenches 135A until the polycrystalline (amorphous) silicon 145 is completely filled in the first trenches 130 and over the lever of the remnant oxide layer 130 to a predetermined thickness.

Thereafter, referring to FIG. 2D, a thermal oxidation process is then performed to conduct the polycrystalline (amorphous) silicon 145 which is outside the first trenches into a thermal oxide layer 150. In the meantime, the ions in the p regions 140 are driven in both laterally and longitudinally into n− epi layer 101 and results in extending the p regions 140. The amorphous silicon inside the first trenches 135 is transformed to polycrystalline silicon.

Figure 2E:
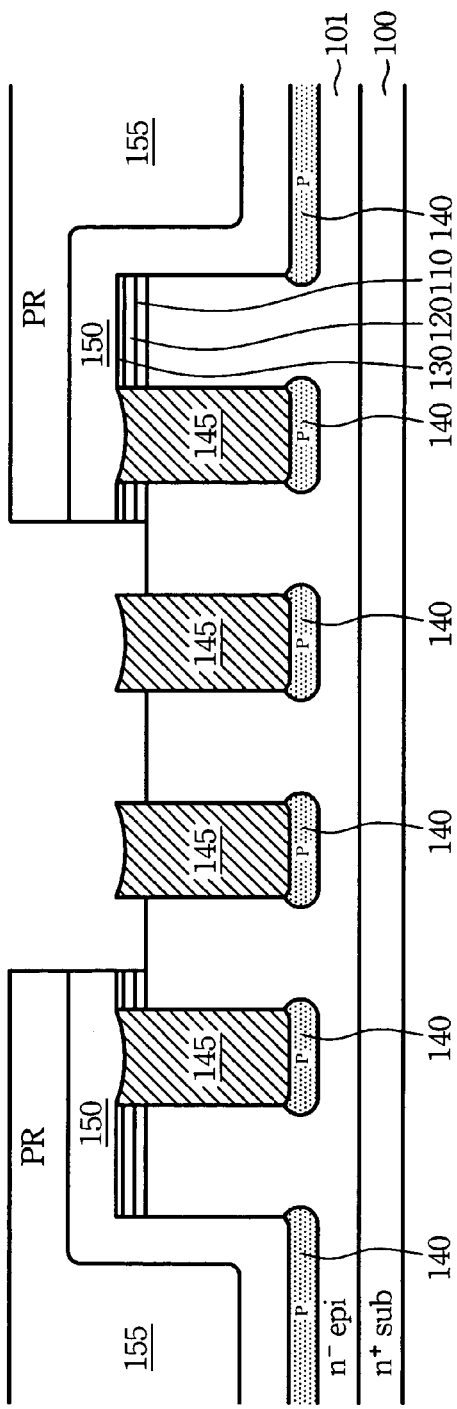
FIG. 2E is a cross-sectional view of defining an active region in accordance with the present invention.

Turning to FIG. 2E, a photoresist pattern 155 is coated on the thermal oxide layer 150 to define an active region and a termination region. In the first preferred embodiment, the active region begins from the interval between the first and the second trench to the interval between the third and the fourth trench. A dry or wet etching is then performed to etch successively the exposed thermal oxide layer 150, and the ONO layer 130, 120, and 110 until the polycrystalline silicon layer 145 and the n− drift layer 101 are exposed. Worth to note, the total number of first trenches in context is four which is just for illustrating conveniently. In practice, the numbers of the first trenches are more. Thus the active region will begin from the interval between the first and the second trench to the interval between the n−1 and the n of first trenches for n>4.

Figure 2F:
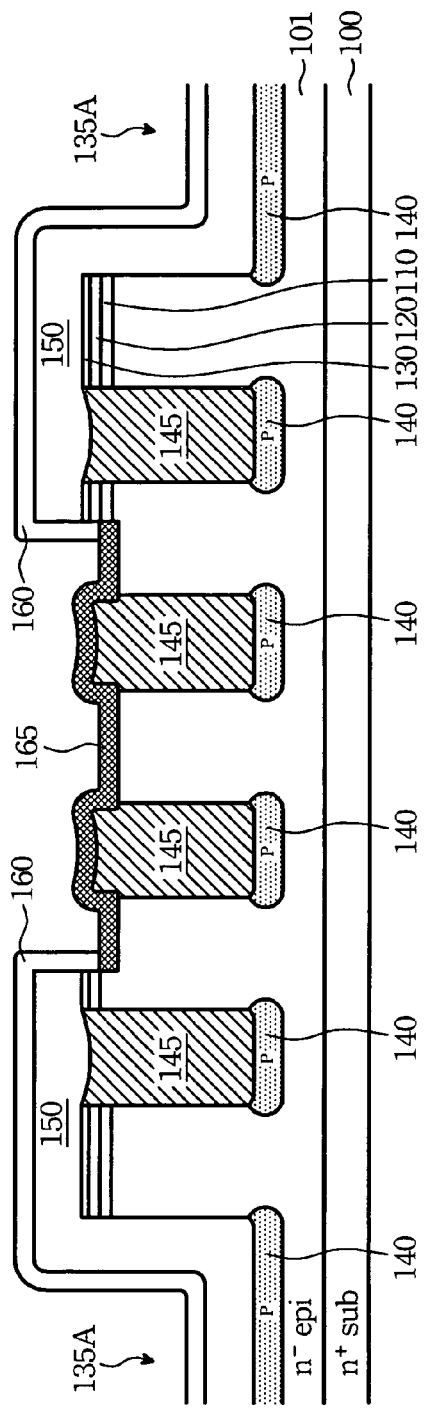
FIG. 2F is a cross-sectional view of forming a barrier metal layer and then thermal anneal to form silicide in accordance with the present invention.

Referring to FIG. 2F, after stripping the photoresist pattern 155, a barrier metal layer 160 is then deposited on all areas. The material of the barrier metal, for example, can be selected from Al, AlCu, AlSiCu, Ti, Ni, Cr, Mo, Pt, Zr, W etc. Subsequently, an anneal step is then performed to form metal silicide layer 165 at the active region by reacting the metal layer and the silicon layer. The un-reacted metal layer 160 is then optionally removed by selectively etching.

Referring to FIG. 2G, a top metal layer is then coated on all areas. The material of the top metal layer 180 is chosen, for example, from Al, AlCu, AlSiCu, Ti/Ni/Ag etc. An anode electrode 180 defining step by patterning is then conducted to etch the undesired portion of the top metal layer 180 and the metal layer 160 if the un-reacted metal layer 160 is not removed previously. The anode electrode 180 is formed to contact the metal silicide layer 165 of the active region and extended to cover all of the first trenches 135 but terminated before termination trenches 135A. After backside material milling by a chemical/mechanical polish to expose and thin the n+ substrate 100, a backside metal layer 190 is formed thereafter as a cathode electrode.

Alternatively, the active region can be appropriate expanded, as is shown in the second preferred embodiment. For example, the active region includes the region over whole first trenches, as is shown in FIG. 2H. The processes are similar to those depictions in FIG. 2E to FIG. 2F of the first embodiment. In the situation, the anode electrode 180 at the active region is extended to cover a portion of termination trenches 135A.

Figure 3A:
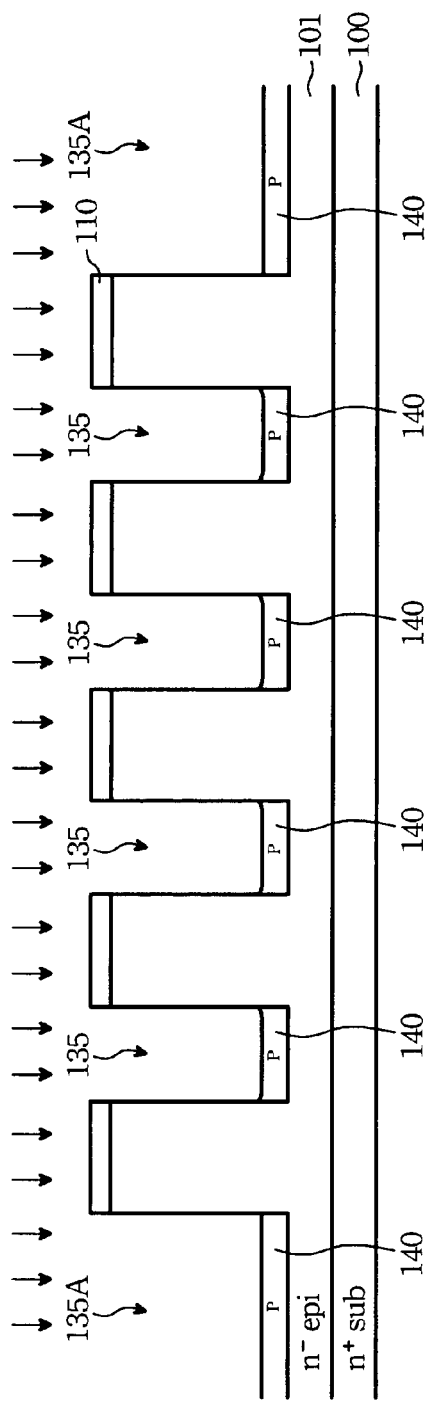
FIG. 3A is a cross-sectional view of patterning the n− epi layer to form first trenches and termination trenches and then performing an ion implant to form p-regions by using an oxide layer as a hard mask in accordance with the present invention.

The processes of the third preferred embodiment are shown in FIG. 3A to FIG. 3E. Referring to FIG. 3A, the a substrate for the Schottky diode is the same material as the first preferred embodiment used, which includes an n+ doped substrate 100 formed with an n− drift layer 101. To define trenches, a thick oxide layer 110 is then formed on the n− drift layer 101, and then patterned to form opening 135 and 135A by lithographic technique and etching steps. Subsequently, an etching step using the oxide layer 110 as a hard mask is continuous to form the first trenches 135 at a core region of the substrate and termination trenches 135A at border region of the substrate. After that a p-type impurity implantation process, for example, is then carried out to implant $B^+$ or $BF_2^+$ ions into the n− epi layer 101 to form a p regions 140, which are beneath the bottoms of the trenches 135 and 135A.

Figure 3B:
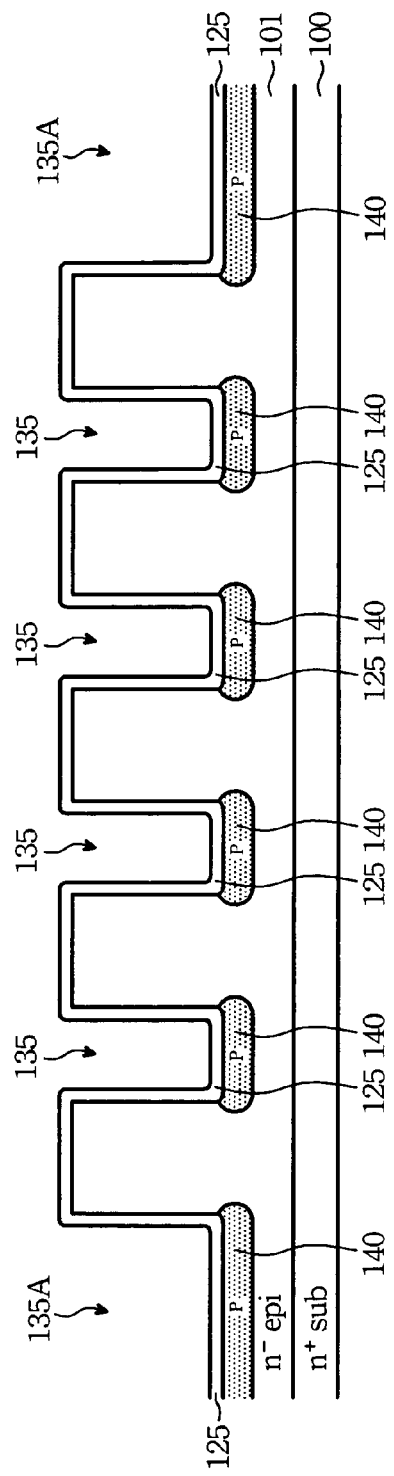
FIG. 3B is a cross-sectional view of removing the hard mask and then forming a thermal oxide lining in accordance with the present invention.
Figure 3G:
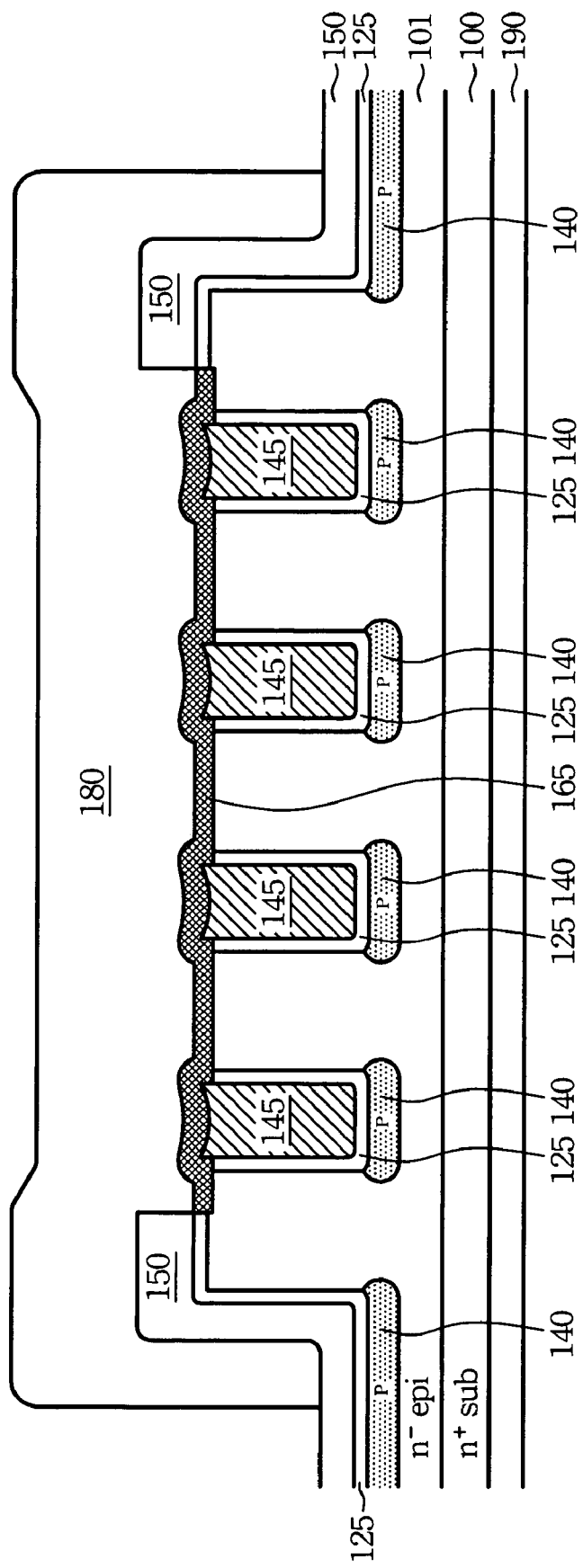
FIG. 3G is a cross-sectional view of Schottky diode in accordance with the first preferred embodiment of the present invention.

Referring to FIG. 3B, the oxide layer 110 remnant is removed and then an oxidation process to form oxide lining 125 is performed to recover all damage during above etching process. In the meantime, the p regions 140 are extended and ions are activated. Turning to FIG. 3C, an undoped polycrystalline or amorphous silicon 145 is then deposited by LPCVD to fill the first trenches 130 and the termination trenches 135A until the polycrystalline (amorphous) silicon 145 is completely filled in the first trenches 130 and over the lever of the remnant oxide layer 130 to a predetermined thickness.

Thereafter, referring to FIG. 3D, a thermal oxidation process is then performed to conduct the polycrystalline (amorphous) silicon 145 outside the first trenches 135 into a thermal oxide layer 150. The p regions 140 are further extended and the amorphous silicon inside the first trenches 135 is transformed to polycrystalline silicon.

Turning to FIG. 3E, a photoresist pattern 155 is coated on the thermal oxide layer 150 to define active region. The active region begins from the interval between the first and the second trench to the interval between the third and the fourth trench. A dry or wet etching is then performed to etch successively the exposed thermal oxide layer 150 and the oxide layer 110 until the polycrystalline silicon layer 145 and the n− epi-layer 101 are exposed.

Referring to FIG. 3F, after stripping the photoresist pattern 155, a barrier metal layer 160 is then deposited on all areas. The material of the barrier metal, for example, can be selected from Al, AlCu, AlSiCu, Ti, Ni, Cr, Mo, Pt, Zr, and W etc. Subsequently, an anneal step is then performed to form a silicide layer 165 at the active region. The un-reacted metal layer 160 is then optionally removed by selectively etching.

Still referring to FIG. 3F, a top metal layer is then coated on all areas. An anode electrode 180 defining step by patterning is then conducted to etch the undesired portion of the top metal layer 180 and the metal layer 160 if it exists. The anode electrode 180 is formed to contact the metal silicide layer 165 of the active region and extended to cover all of the first trenches 135 but ended before termination trenches 135A. After backside material milling by a chemical/mechanical polish to expose and thin the n+ substrate 100, a backside metal layer 190 is formed thereafter as a cathode electrode.

The fourth preferred embodiment is similar to the second preferred embodiment having the active region over all of the first trenches 135 and the anode electrode 180 is formed on the metal silicide layer and extended to cover a portion of the termination trenches 135A.

The benefits of the preferred embodiment:

The Schottky diode according the present invention is a trench-type, which generally has higher breakdown voltage than conventional planar-type Schottky diode.

The undoped polycrystalline silicon filled in the first trenches provides high resistance, result in, lower forward minority carrier and reverse recovery time. Consequently, the Schottky diode provides high speed switch performance.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A power rectifier device, comprising:
an n+ substrate having a n-drift formed thereon;
a cathode metal layer formed on a surface of said n+ substrate opposite said n-drift layer;
an active region having a metal silicide layer formed thereon;
a termination region being defined at positions outer of said active region and having termination trenches formed therein;
an insulating layer formed on said n-drift layer and on said termination region;
four trenches along a line and filled with an un-doped polycrystalline silicon layer spaced from each other and a second and a third of said trenches formed into said n+ draft layer of said substrate, and a first and a fourth of said trenches formed into said insulating layer and said n− drift layer of said substrate;
said active region being defined from a first interval to a second interval, wherein said first interval is in between the first one and the second one of said trenches, and said second interval is in between the third one and the fourth one of said trenches;
a thermal oxide layer formed on said termination region;
an anode electrode formed on said metal silicide layer and extended to cover the first and the fourth of said trenches, wherein said insulating layer is a stack layer, from said epi-layer sequentially, formed of a first oxide layer, a nitride layer, and a second oxide layer having a thickness between 5 nm to 100 nm, 50 nm to 300 nm, and 0 nm to 1000 nm, respectively.

2. The power rectifier device according to claim 1 wherein said active region further comprises the first and the fourth of said trenches, so that said insulating layer formed thereon is removed and thus said metal silicide layer is formed over said four trenches and said anode electrode is formed extended to cover a portion of said termination trenches.

3. The power rectifier device according to claim 1 further comprises an oxide lining formed on a sidewall and bottom of said four trenches and said termination trenches.

4. The power rectifier device according to claim 1 wherein said anode electrode is a layer selected from Al, AlCu, AlSiCu or a stack layer formed of Ti, Ni, and Ag.

* * * * *